United States Patent
Ng et al.

(10) Patent No.: US 9,041,483 B2
(45) Date of Patent: May 26, 2015

(54) ATTENUATOR

(75) Inventors: Tsz Chun Ng, Hong Kong (CN); Naoto Matono, Hong Kong (CN); Yat Hin Chan, Hong Kong (CN); Hui Wang, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 276 days.

(21) Appl. No.: 13/479,639

(22) Filed: May 24, 2012

(65) Prior Publication Data

US 2013/0181792 A1    Jul. 18, 2013

(30) Foreign Application Priority Data

Jan. 18, 2012 (CN) .......................... 2012 1 0018449

(51) Int. Cl.
  H01P 1/22 (2006.01)
  H03H 7/24 (2006.01)
  H01C 1/14 (2006.01)

(52) U.S. Cl.
  CPC .................. *H01P 1/227* (2013.01); *H03H 7/24* (2013.01); *H01C 1/14* (2013.01)

(58) Field of Classification Search
  CPC ............. H01P 1/227; H03H 7/24; H01C 1/14
  USPC .............................................. 333/81 A, 81 R
  See application file for complete search history.

(56) References Cited

U.S. PATENT DOCUMENTS

| 4,272,739 | A  | * | 6/1981  | Nesses .......................... 333/81 A |
| 4,965,538 | A  | * | 10/1990 | Mickey, III .................. 333/81 A |
| 6,943,662 | B2 |   | 9/2005  | Tanimura |
| 2007/0018782 | A1 | * | 1/2007 | Tsukada ....................... 338/309 |
| 2008/0211619 | A1 |   | 9/2008 | Belman et al. |

FOREIGN PATENT DOCUMENTS

| JP | 6-104591 | 4/1994 |
| JP | 11-55008 | 2/1999 |
| JP | 2002-353001 | 12/2002 |
| JP | 2012-5050 | 1/2012 |

OTHER PUBLICATIONS http://dictionary.reference.com/: Definition of "Inflection", accessed on Oct. 14, 2014.*

* cited by examiner

*Primary Examiner* — Benny Lee
*Assistant Examiner* — Jorge Salazar, Jr.
(74) *Attorney, Agent, or Firm* — Nixon & Vanderhye, P.C.

(57) ABSTRACT

An attenuator includes, on a substrate: a resistor section; an insulating film covering the resistor section; and connection terminals covering the insulating film and connected in part to the resistor section. A total thickness of the insulating film and the connection terminal in a region where the insulating film and the connection terminal overlap with the resistor section is from 50 μm to 200 μm.

4 Claims, 5 Drawing Sheets

ATTENUATOR

This application claims priority to Chinese patent application No. CN 201210018449.1, filed on Jan. 18, 2012, the entire contents of which are hereby incorporated herein.

BACKGROUND

The invention relates to an attenuator that is used at, for example, a terminal end section of a high frequency transmission circuit, and is to attenuate an input signal.

In related art, an attenuator having a resistor has been used for suppressing unnecessary reflection of a signal or attenuating an input signal to be outputted, for example, at an end of a signal line of a high frequency circuit (for example, see Japanese Unexamined Patent Application Publication No. Hei6-104591). Such an attenuator is desired to have the following properties: downsized and simplified configuration; easiness of connection to a signal line; excellent heat dissipation ability at the time of being supplied with power and less deterioration in the ability due to heat (excellent power durability); constant characteristic impedance in a predetermined frequency band; and less and stable reflectance loss in a predetermined frequency band (excellent high frequency property).

For example, in Japanese Unexamined Patent Application Publication No. Hei11-55008, there is disclosed a power resistor for high frequency capable of achieving necessary power durability without increasing an area of a resistor in proportion to a rated power value.

SUMMARY

Such an attenuator generally has a configuration in which a circuit pattern including a plurality of resistors, connection terminals, ground electrodes, and the like is provided on an insulating substrate. Here, in consideration of heat generation of the resistors, the insulating substrate is made of a highly heat-conductive material excellent in heat dissipation, such as aluminum nitride (AlN), aluminum oxide (AlOx), beryllium oxide (BeO), or AlTiC ($Al_2O_3.TiC$).

However, even in the case where the insulating substrate is made of such a highly heat-conductive material, if the attenuator is further downsized in future, there is a possibility that sufficient heat dissipation is not achieved. Alternatively, for example, in the case where the attenuator is used in a high frequency circuit that is supplied with a high power of 10 W or more, there is a possibility that the amount of the generated heat is increased and sufficient heat dissipation ability is not exerted. In such a case, it is conceivable that the connection terminals are heated, for example, a solder bonding the connection terminals to external connection wirings is melted or softened, and thus the connection wirings are disbonded from the connection terminals. In addition, the insulating substrate made of such a highly heat-conductive material is expensive compared with an insulating substrate made of silicon (Si) or glass, thereby increasing component cost.

In view of the foregoing disadvantages, it is desirable to provide a downsized attenuator with improved heat dissipation.

An attenuator according to an embodiment of the invention includes, on a substrate: a resistor section; an insulating film covering the resistor section; and connection terminals covering the insulating film and connected in part to the resistor section. A total thickness of the insulating film and the connection terminal in a region where the insulating film and the connection terminal overlap with the resistor section is from 50 µm to 200 µm.

In the attenuator according to the embodiment of the invention, since the total thickness of the insulating film and the connection terminal in the region where the insulating film and the connection terminal overlap with the resistor section is 50 µm or more, the heat generated in the resistor section is efficiently transmitted to the outside. In addition, since the total thickness is 200 µm or less, mechanical bonding strength between the resistor section and the insulating film is ensured.

In the attenuator according to the embodiment of the invention, since the total thickness of the insulating film and the connection terminal which cover the resistor section is set in a predetermined range, the heat generated from the resistor is allowed to be dissipated efficiently while impact resistance is maintained. Therefore, even if the attenuator is downsized, the solder at the terminal section is allowed to be prevented from melting while separation of the insulating film and the connection terminal is prevented. In addition, the improved heat dissipation is allowed to prevent characteristics deterioration of the attenuator due to the heat. Consequently, while the whole configuration of the attenuator is downsized, the characteristics deterioration and malfunction due to the generated heat is avoidable.

DETAILED DESCRIPTION

Hereinafter, a preferred embodiment of the invention will be described in detail with reference to accompanying drawings.

[Configuration of Attenuator 1]

Figure 1:
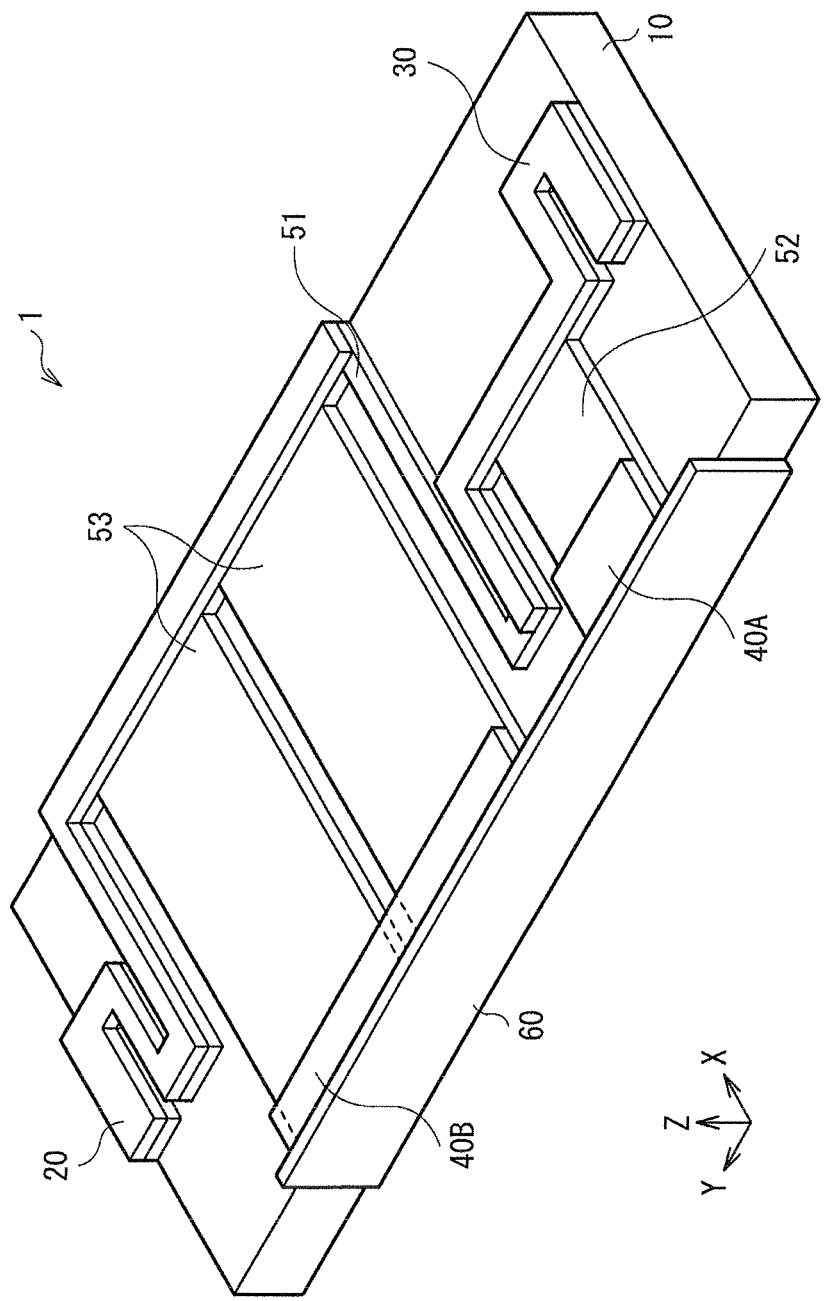
FIG. 1 is a perspective view illustrating a general configuration of an attenuator according to an embodiment of the invention.
Figure 2:
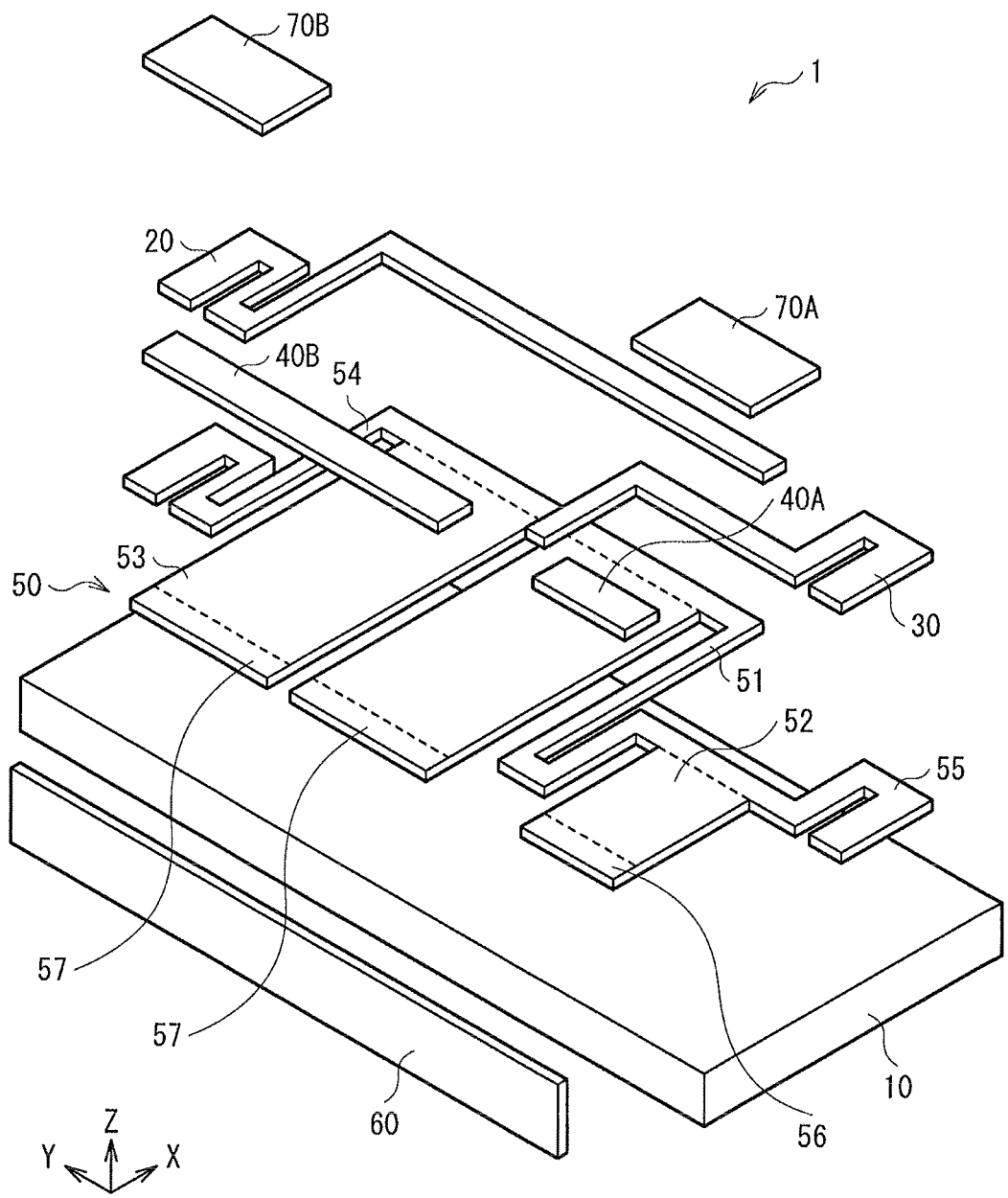
FIG. 2 is an exploded perspective view of the attenuator illustrated in FIG. 1.
Figure 3:
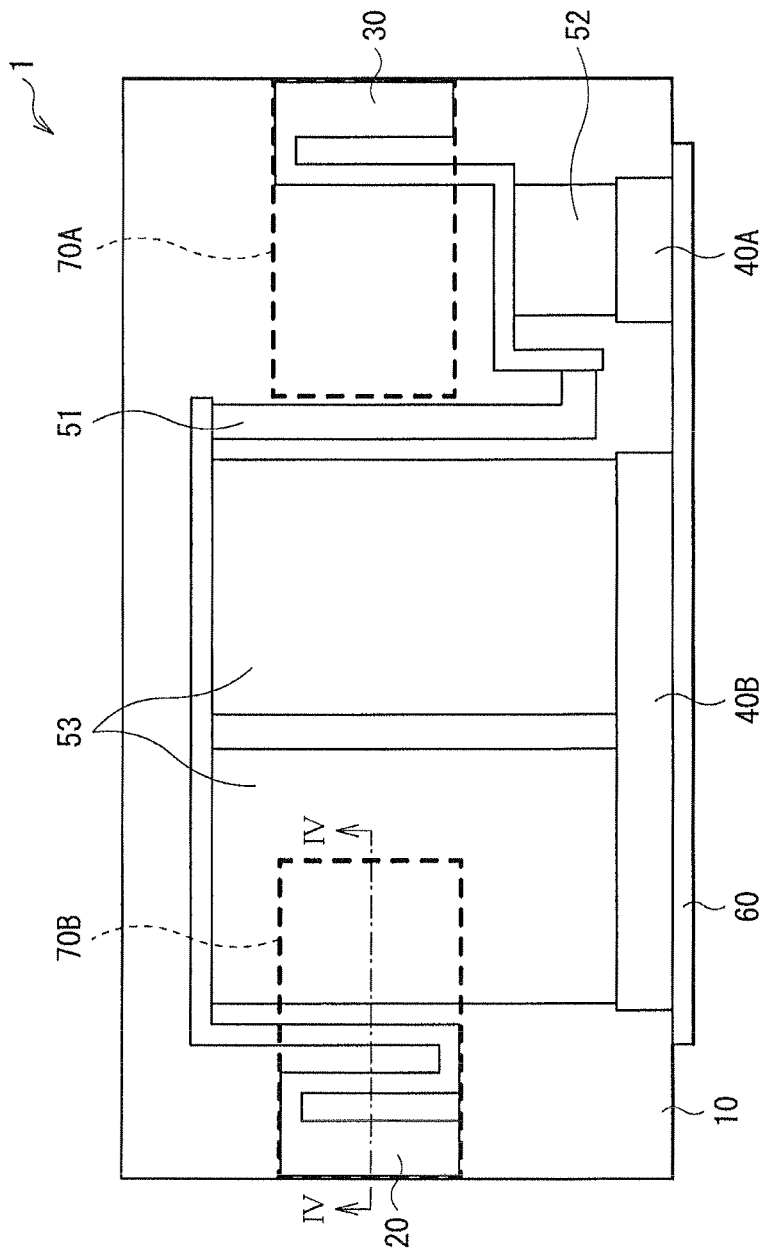
FIG. 3 is a plan view of the attenuator illustrated in FIG. 1.
Figure 4:
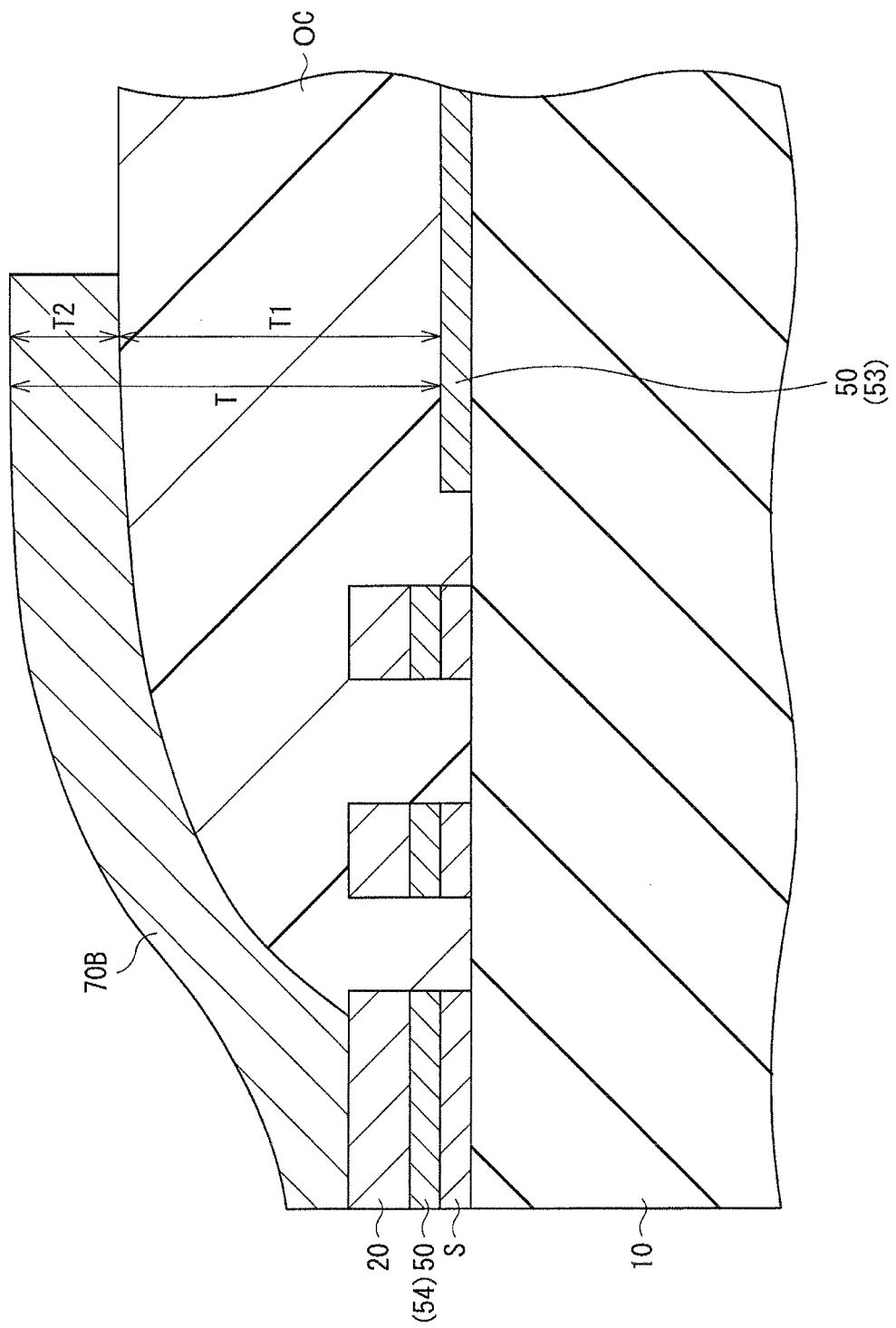
FIG. 4 is a partial sectional view of the attenuator illustrated in FIG. 1.

FIG. 1 is a perspective view illustrating a general configuration of an attenuator 1 according to an embodiment of the invention, and FIG. 2 is an exploded perspective view thereof. FIG. 3 is a plan view of the attenuator 1 illustrated in FIG. 1. FIG. 4 is a partial sectional view of the attenuator 1 in an arrow direction along IV-IV line illustrated in FIG. 3.

The attenuator 1 is an electronic device attenuating an input signal that is included in a predetermined frequency band to an appropriate signal level. The attenuator 1 is connected to an antenna transmitting and receiving a signal in a relay station that performs high frequency radio communication, for example, and is used for attenuating a signal reflected by the antenna to an appropriate signal level.

As illustrated in FIG. 1 to FIG. 4, the attenuator 1 includes, for example, on a surface of a plate-like insulating substrate 10 extending in XY plane, an input electrode 20, an output electrode 30, a pair of ground electrodes 40A and 40B, an attenuating resistor portion 51, and resistor portions 52 and 53.

The insulating substrate 10 is made of an insulating material including one or more of aluminum nitride (AlN), aluminum oxide (AlOx), beryllium oxide (BeO), and $Al_2O_3.TiC$, for example. The constituent material of the insulating substrate 10 is desirably high in heat conductivity and excellent in workability, like the materials described above.

The input electrode 20, the output electrode 30, and the ground electrodes 40A and 40B are each made of a conductor having a substantially-rectangular planar shape. These are made of a highly conductive material such as Al (aluminum), Au (gold), Ag (silver), Ta (tantalum), Ru (ruthenium), and Rh (rhodium), in addition to Cu (copper). The constituent materials of the input electrode 20, the output electrode 30, and the ground electrodes 40A and 40B may be different from one another, but are preferably the same because manufacturing processes are simplified.

The input electrode 20, the output electrode 30, and the ground electrodes 40A and 40B are provided on the insulating substrate 10 through a resistance film pattern 50 (see FIG. 2) including the attenuating resistor portion 51 and the resistor portions 52 and 53. The input electrodes 20, the output electrode 30, and the ground electrodes 40A and 40B are preferably provided on the same layer. The phrase "provided on the same layer" herein means that the height position (position in Z-axis direction) of the input electrode 20 from the surface (XY plane) of the insulating substrate 10 as a reference partially or totally corresponds to height positions of the output electrode 30 and the ground electrodes 40A and 40B. In other words, it means that a projection of each of the input electrode 20, the output electrode 30, and the ground electrodes 40A and 40B projected on the XY plane are partially or totally overlaid on one another. In this case, most preferably, the thicknesses of the input electrode 20, the output electrode 30, and the ground electrodes 40A and 40B are equal to one another, and an upper end and a lower end of each of the input electrode 20, the output electrode 30, and the ground electrodes 40A and 40B corresponds to one another in the Z-axis direction, because the dimension as a whole in the Z-axis direction is further decreased. Incidentally, the thickness and the positions of the upper end and the lower end thereof may be different from one another.

In addition, desirably, the input electrode 20, the output electrode 30, and the ground electrodes 40A and 40B are each covered with a plating film containing one or more of Cu (copper), Ni (nickel), and Sn (tin). This is because, when a lead line to the outside is bonded to the input electrode 20 and the like by solder bonding, the plating film functions as a barrier layer preventing the solder from spreading, and the favorable wettability of the solder is ensured. Moreover, the ground electrodes 40A and 40B are conducted to each other and are grounded through a ground section 60 provided to be in contact with the side surfaces of the ground electrodes 40A and 40B and the side surface of the insulating substrate 10.

In the resistance film pattern 50, for example, the attenuating resistor portion 51, the resistor portions 52 and 53, and overlap portions 54 to 57 are all made of the same material, and are integrally formed. The overlap portions 54 to 57 overlap with the input electrode 20, the output electrode 30, and the ground electrodes 40A and 40B, respectively, in a stacking direction. A top surface of the overlap portion 54 is in contact with a bottom surface of the input electrode 20, a top surface of the overlap portion 55 is in contact with a bottom surface of the output electrode 30, and top surfaces of the overlap portions 56 and 57 are in contact with bottom surfaces of the ground electrodes 40A and 40B, respectively. In addition, as the constituent material of the resistance film pattern 50, for example, tantalum nitride (TaN) and nickel chromium (NiCr)-based alloy are suitable. Using such materials leads to increased amount of heat generation and efficient attenuation of the input signal even if the resistance film pattern 50 has a small plane area, and therefore it is advantageous to downsize the whole configuration of the attenuator 1. Note that between the insulating substrate 10 and the overlap portions 54 to 57 which overlap with the input electrode 20, the output electrode 30, and the ground electrodes 40A and 40B, respectively, a base layer S made of Ti (titanium), Cr (chromium), an alloy containing Ti and Cu, and the like may be provided (see FIG. 4).

The attenuating resistor portion 51 has a function to attenuate the input signal from the input electrode 20 to a predetermined amplitude. In other words, the attenuating resistor portion 51 is an important factor determining the attenuation degree of the signal when the input signal from the input electrode 20 is output from the output electrode 30. The attenuating resistor portion 51 has an inductance component depending on its planar shape.

A resistance value between the input electrode 20 and the ground electrode 40B (a resistance value of the resistor portion 53 in a Y-axis direction) is preferably larger than a resistance value between the output electrode 30 and the ground electrode 40A (a resistance value of the resistor portion 52 in the Y-axis direction), and the input electrode 20 is preferably located near the ground electrode 40A rather than the ground electrode 40B. The resistor portions 52 and 53 are resistors determining a circuit constant in the attenuator 1.

Moreover, in the attenuator 1, an insulating protective film OC (see FIG. 4) is provided to cover portions other than the input electrode 20, the output electrode 30, and the ground electrodes 40A and 40B, that is, the attenuating resistor portion 51, the resistor portions 52 and 53, and the exposed insulating substrate 10. As the constituent material of the protective film OC, an epoxy-based resin, a polyimide resin, or glass is preferable. Alternatively, the protective film may be made of aluminum oxide. Note that the protective film may be provided to cover a part of each of the input electrode 20, the output electrode 30, and the ground electrodes 40A and 40B as well.

On the protective film OC, connection terminals 70A and 70B made of, for example, Cu (copper) are partially provided. The connection terminals 70A and 70B cover a part of the top surface of the protective film OC, and are connected in part to the input electrode 20 and the output electrode 30, respectively. The connection terminal 70B is provided to overlap with a part of the resistor portion 53. Note that the connection terminal 70A may also be provided to overlap with a part of the resistor portion 52, for example. In addition, the connection terminals 70A and 70B may totally cover the attenuating resistor section 51 and the resistor portions 52 and 53. The connection terminals 70A and 70B are electrically connected to a connection wiring from the outside by solder and the like.

The total thickness of the protective film OC and the connection terminals 70A and 70B in a region where the protective film OC and the connection terminals 70A and 70B overlap with the attenuating resistor section 51 or the resistor sections 52 and 53, that is, the sum T of the thickness T1 and the thickness T2 illustrated in FIG. 4 is desirably from 50 μm to 200 μm. This is because the heat generated in the resistance film pattern 50 (specifically, in the resistor portions 52 and 53) is efficiently transmitted to the outside when the thickness T is 50 μm or more. In addition, this is because when the thickness T is 200 μm or less, the mechanical bonding strength between the resistor portions 52 and 53 or the like and the protective film OC covering them is ensured, and the separation of the protective film OC and the connection terminals 70A and 70B due to exfoliation of the protective film OC is avoidable.

The thickness T1 of the protective film OC is preferably 24 μm or more and the thickness T2 of the connection terminals 70A and 70B is preferably 21 μm or more because the heat is efficiently dissipated.

[Method of Manufacturing Attenuator 1]

Next, a method of manufacturing the attenuator 1 will be described.

First, the insulating substrate 10 is prepared, then, a resistance film which becomes the resistance film pattern 50 later, and an electrode film which becomes the input electrode 20, the output electrode 30, and the ground electrodes 40A and 40B later are formed and stacked with use of the above-described respective materials over the entire surface of the insulating substrate 10. The resistance film and the electrode film may be formed by gas phase methods such as sputtering. Then, the input electrode 20, the output electrode 30, and the ground electrodes 40A and 40B with respective shapes are formed on the predetermined respective positions through patterning of the electrode film by photolithography. Subsequently, the resistance film pattern 50 including the attenuating resistor portion 51, the resistor portions 52 and 53, and the overlap portions 54 to 57 with respective shapes are formed through patterning of the resistance film by photolithography as well. After that, the protective film OC is formed to cover the attenuating resistor portion 51, the resistor portions 52 and 53, and the like. Further, the connection terminals 70A and 70B are formed to cover a part of the protective film OC and to be partially in contact with the input electrode 20 and the output electrode 30, respectively. Finally, the insulating substrate 10 is cut out to a predetermined shape, the ground section 60 is formed, and thus the attenuator 1 is completed. The ground section 60 is formed by forming a base layer (not illustrated) to cover at least the end surfaces of the ground electrodes 40A and 40B which correspond to a short side of the insulating substrate 10, and then forming a plated layer to cover the base layer.

[Effect of Attenuator 1]

As described above, in the embodiment, since the thickness T of the part where the protective film OC and the connection terminals 70A and 70B overlap with the resistor portions 52 and 53 and the like is 50 μm or more, the heat generated in the resistor portions 52 and 53 and the like during operation is efficiently transmitted to the outside. In addition, since the thickness T is 200 μm or less, the mechanical bonding strength between the resistor portions 52 and 53 and the like and the protective film OC is ensured. In other words, the attenuator 1 is allowed to efficiently dissipate the heat generated in the resistor portions 52 and 53 while maintaining impact resistance. Therefore, even when the attenuator 1 is downsized, while the protective film OC and the connection terminals 70A and 70B are prevented from separating, the solder is prevented from melting or excess softening in the connection terminals 70A and 70B, and therefore the external wiring is prevented from separating from the connection terminals 70A and 70B. Moreover, the improved heat dissipation is allowed to prevent characteristics deterioration of the attenuator due to the heat. Consequently, while the whole configuration of the attenuator 1 is downsized, the characteristics deterioration and malfunction due to the heat generation is avoidable.

EXAMPLES

Next, specific examples of the invention will be described in detail.

Examples 1 to 12

The attenuator 1 illustrated in FIG. 1 was manufactured according to the manufacturing method described in the embodiment. Examples 1 to 12 had the same structure except that the thickness T1 (μm) of the protective film OC and the thickness T2 (μm) of the connection terminals 70A and 70B were different mutually. The resistance film pattern 50 was formed with use of nickel chromium (NiCr)-based alloy by sputtering. As the input electrode 20, the output electrode 30, and the ground electrodes 40A and 40B, a copper (Cu) layer was formed on the resistance film pattern 50 by sputtering. Note that on the input electrode 20, the output electrode 30, and the ground electrodes 40A and 40B, two-layer structure including a nickel layer and a tin layer was further formed by plating. In addition, the insulating substrate 10 was made of AlN (aluminum nitride).

Moreover, the dimensions of each component are as follows (see FIG. 3).

Insulating substrate 10; x=6.0 mm, y=3.0 mm
Input electrode 20; x=0.3 mm, y=1.0 mm
Output electrode 30; x=0.3 mm, y=1.0 mm
Ground electrode 40; x=0.8 mm, y=0.3 mm
Resistor portion 52; x=0.7 mm, y=0.6 mm
Resistor portion 53; x=1.4 mm, y=2.3 mm
Connection terminal 70A; x=1.7 mm, y=1.0 mm
Connection terminal 70B; x=1.7 mm, y=1.0 mm
Thickness of protective film OC; T1 (μm) (see Table 1)
Thickness of each of connection terminals 70A and 70B; T2 (μm) (see Table 1)

Figure 5:
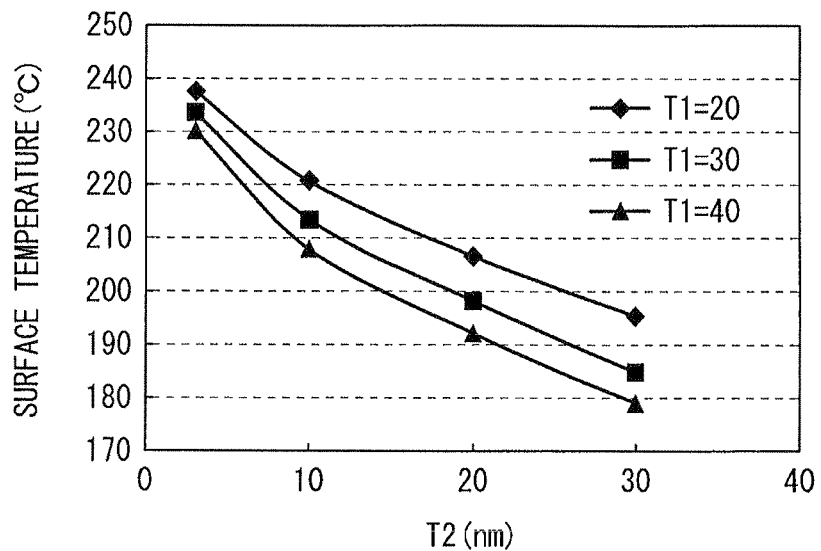
FIG. 5 is a characteristic diagram illustrating a relationship between a thickness of a protective film, a thickness of a connection terminal, and a surface temperature of the connection terminal in Examples.
Figure 6:
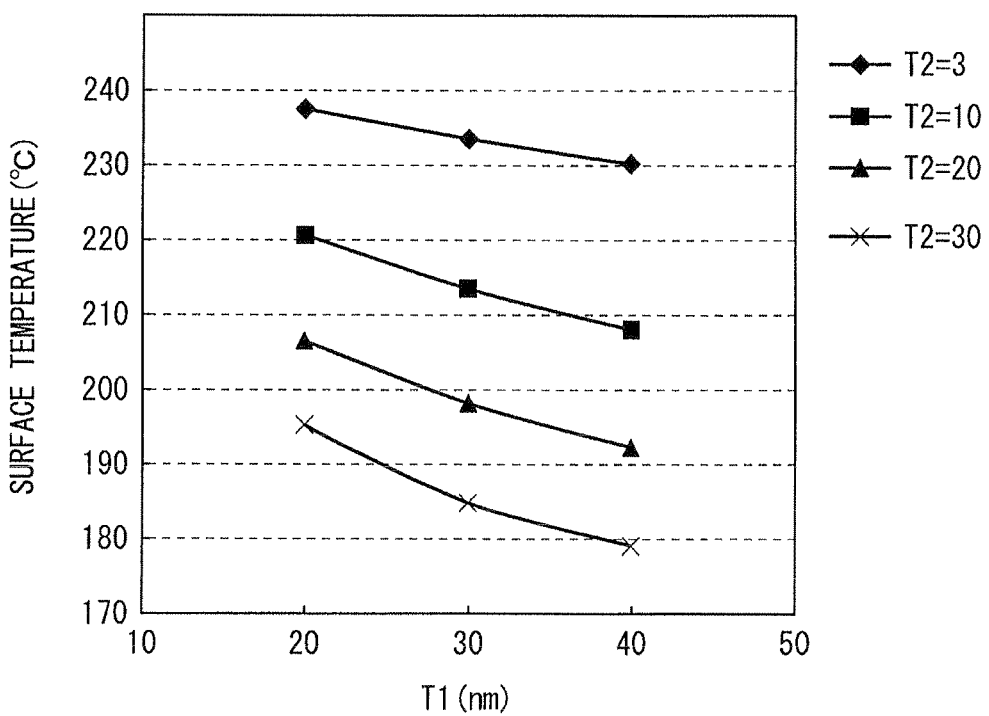
FIG. 6 is another characteristic diagram illustrating a relationship between the thickness of the protective film, the thickness of the connection terminal, and the surface temperature of the connection terminal in Examples.

The surface temperature of the connection terminal 70B in each of the examples 1 to 12 was measured. The results are illustrated in Table 1 and FIGS. 5 and 6. In FIG. 5, the horizontal axis indicates the thickness T2 (μm), and the vertical axis indicates the surface temperature (° C.) of the connection terminal 70B. In FIG. 6, the horizontal axis indicates the thickness T1 (μm), and the vertical axis indicates the surface temperature (° C.) of the connection terminal 70B. As is obvious from FIG. 5, it was found that the surface temperature of the connection terminal 70B is lower than 200° C. when the total thickness T of the thickness T1 and the thickness T2 is 50 μm or more and the thickness T2 is 20 μm or less. Moreover, as is obvious from FIG. 6, it was found that the surface temperature of the connection terminal 70B is lower than 200° C. when the total thickness. T of the thickness T1 and the thickness T2 is 50 μM or more and the thickness T1 is 20 μm or less. Specifically, it was found that the surface temperature of the connection terminal 70B is lower than 190° C. when both the thickness T1 and the thickness T2 are 30 μm or more.

TABLE 1

|  | Thickness T1 (μm) | Thickness T2 (μm) | Surface Temperature (° C.) |
|---|---|---|---|
| Example 1 | 20 | 3 | 237.7 |
| Example 2 | 20 | 10 | 220.8 |
| Example 3 | 20 | 20 | 206.6 |
| Example 4 | 20 | 30 | 195.3 |
| Example 5 | 30 | 3 | 233.7 |
| Example 6 | 30 | 10 | 213.5 |

TABLE 1-continued

|  | Thickness T1 (μm) | Thickness T2 (μm) | Surface Temperature (° C.) |
|---|---|---|---|
| Example 7 | 30 | 20 | 198.2 |
| Example 8 | 30 | 30 | 184.8 |
| Example 9 | 40 | 3 | 230.3 |
| Example 10 | 40 | 10 | 208.0 |
| Example 11 | 40 | 20 | 192.1 |
| Example 12 | 40 | 30 | 178.9 |

Hereinbefore, although the invention has been described with referring to the embodiment and the examples, the invention is not limited thereto, and various modifications may be made. For example, in the attenuator 1 illustrated in FIGS. 1 to 3, the resistance film pattern 50, the input electrode 20, the output electrode 30, and the ground electrodes 40A and 40B are stacked in this order from the insulating substrate 10 side, however the stacking order may be reversed. For example, in the case where the resistance film pattern 50 is formed with use of a material of nickel chromium based alloy, it is difficult to form the input electrode 20, the output electrode 30, and the ground electrodes 40A and 40B thereon because the strong oxide film is likely to be formed rapidly on the resistance film pattern 50. Therefore, in such a case, a structure in which the input electrode 20, the output electrode 30, the ground electrodes 40A and 40B, and the resistance film pattern 50 are stacked in order on the insulating substrate 10 is desirably employed.

Moreover, the planar shape of each of the input electrode 20, the output electrode 30, the ground electrodes 40A and 40B, and the resistance film pattern 50 is not limited to the illustrated shape. In other words, the accompanying drawings in this specification are merely examples, and are not intended to limit the scope of the invention. For example, the dimension ratio is not limited to that illustrated in the accompanying drawings, and may be appropriately set. The arrangement position of each component may also be appropriately modified.

1 . . . attenuator, 10 . . . insulating substrate, 20 . . . input electrode, 30 . . . output electrode, 40 (40A and 40B) . . . ground electrode, 50 . . . resistance film pattern, 51 . . . attenuating resistor portion, 52, 53 . . . resistor portion, 60 . . . ground section, 70A, 70B . . . connection terminal, OC . . . protective film

What is claimed is:

1. An attenuator comprising, on a substrate:
   a resistor section including an attenuating resistor portion having an inflectional planar shape;
   an insulating film covering the resistor section; and
   a connection terminal covering the insulating film and connected in part to the resistor section, wherein;
   a total thickness of the insulating film and the connection terminal in a region where the insulating film and the connection terminal overlap with the resistor section is from 50 μm to 200 μm, and
   the resistor section further includes first and second resistor portions, the attenuating resistor portion being located between the first and second resistor portions.

2. The attenuator according to claim 1, wherein
   the thickness of the insulating film in the region where the insulating film overlaps with the resistor section is 24 μm or more, and
   the thickness of the connection terminal in the region where the connection terminal overlaps with the resistor section is 21 μm or more.

3. The attenuator according to claim 1, wherein the attenuating resistor portion is configured to attenuate an input signal from the connection terminal to a predetermined amplitude.

4. The attenuator according to claim 1, wherein the attenuating resistor portion and the connection terminal overlap on the opposite side of the insulation film.

* * * * *